United States Patent
Fischer et al.

(10) Patent No.: US 8,487,453 B2
(45) Date of Patent: Jul. 16, 2013

(54) INTEGRATED CIRCUIT WITH PADS CONNECTED BY AN UNDER-BUMP METALLIZATION AND METHOD FOR PRODUCTION THEREOF

(75) Inventors: Armin Fischer, Munich (DE); Alexander Von Glasow, Deisenhofen (DE)

(73) Assignee: Infineon Technologies AG, Neubiberg (DE)

(*) Notice: Subject to any disclaimer, the term of this patent is extended or adjusted under 35 U.S.C. 154(b) by 74 days.

(21) Appl. No.: 13/032,248

(22) Filed: Feb. 22, 2011

(65) Prior Publication Data

US 2011/0140236 A1 Jun. 16, 2011

Related U.S. Application Data

(60) Division of application No. 11/409,255, filed on Apr. 21, 2006, now Pat. No. 7,919,363, which is a continuation of application No. PCT/DE2004/002284, filed on Oct. 14, 2004.

(30) Foreign Application Priority Data

Oct. 23, 2003 (DE) .................................. 103 49 749

(51) Int. Cl.
- *H01L 23/48* (2006.01)
- *H01L 23/02* (2006.01)
- *H01L 29/40* (2006.01)

(52) U.S. Cl.
USPC ............................ 257/778; 257/686; 257/758

(58) Field of Classification Search
USPC ........................................ 257/686, 758, 778
See application file for complete search history.

(56) References Cited

U.S. PATENT DOCUMENTS

| | | |
|---|---|---|
| 5,578,836 A | 11/1996 | Husher et al. |
| 5,844,297 A | 12/1998 | Crafts et al. |
| 5,883,435 A | 3/1999 | Geffken et al. |
| 6,194,235 B1 | 2/2001 | Ma |
| 6,222,212 B1 | 4/2001 | Lee et al. |
| 6,300,688 B1 | 10/2001 | Wong |
| 6,451,681 B1 | 9/2002 | Greer |
| 6,515,343 B1 | 2/2003 | Shroff et al. |
| 6,515,344 B1 | 2/2003 | Wollesen |
| 6,577,017 B1 | 6/2003 | Wong |
| 6,730,989 B1 | 5/2004 | Reithinger et al. |
| 6,831,294 B1 | 12/2004 | Nishimura et al. |
| 6,841,813 B2 | 1/2005 | Walker et al. |
| 6,841,875 B2 * | 1/2005 | Ohsumi ........................ 257/738 |
| 6,911,730 B1 | 6/2005 | New |
| 6,987,031 B2 * | 1/2006 | Eng et al. ...................... 438/108 |
| 7,029,946 B2 * | 4/2006 | Murata .......................... 438/106 |
| 7,947,978 B2 * | 5/2011 | Lin et al. ........................ 257/48 |

(Continued)

FOREIGN PATENT DOCUMENTS

| | | |
|---|---|---|
| EP | 0 707 343 A2 | 4/1996 |
| EP | 1 073 118 A1 | 1/2001 |
| JP | 05-129441 | 5/1993 |
| WO | WO 92/20095 | 11/1992 |

*Primary Examiner* — James Mitchell
(74) *Attorney, Agent, or Firm* — Slater & Matsil, L.L.P.

(57) ABSTRACT

A semiconductor device includes a semiconductor chip. External connection pads and further pads are disposed over a surface of the semiconductor chip. Selected ones of the further pads are electrically connected to one another so as to activate selected functions within the semiconductor chip.

19 Claims, 2 Drawing Sheets

U.S. PATENT DOCUMENTS

| | | | |
|---|---|---|---|
| 8,178,435 B2 * | 5/2012 | Lin | 438/622 |
| 2001/0034070 A1 | 10/2001 | Damon et al. | |
| 2002/0000672 A1 | 1/2002 | Mori | |
| 2002/0008309 A1 | 1/2002 | Akiyama | |
| 2002/0149105 A1 | 10/2002 | Yoon et al. | |
| 2002/0149391 A1 | 10/2002 | Duesman | |
| 2002/0163019 A1 * | 11/2002 | Mohsen | 257/209 |
| 2003/0045026 A1 | 3/2003 | Fogal et al. | |
| 2003/0098495 A1 | 5/2003 | Amo et al. | |
| 2003/0099907 A1 * | 5/2003 | Tei et al. | 430/313 |
| 2003/0129819 A1 | 7/2003 | Tseng | |
| 2003/0155659 A1 | 8/2003 | Verma et al. | |
| 2003/0162331 A1 | 8/2003 | Tong et al. | |
| 2004/0007778 A1 | 1/2004 | Shinozaki et al. | |
| 2004/0021199 A1 | 2/2004 | Trivedi | |
| 2004/0048458 A1 * | 3/2004 | Yang | 438/612 |
| 2004/0051177 A1 | 3/2004 | Schoellkopf | |
| 2005/0006688 A1 | 1/2005 | Solo De Zaldivar | |
| 2005/0221540 A1 * | 10/2005 | Fischer et al. | 438/132 |
| 2006/0118927 A1 * | 6/2006 | Verma et al. | 257/676 |
| 2006/0278895 A1 * | 12/2006 | Burr et al. | 257/209 |
| 2009/0067135 A1 * | 3/2009 | Hirai | 361/715 |

* cited by examiner ent of the chip into a housing. In previous solutions, this correction was possible only up to the last metallization plane. Processing operations carried out afterward, such as passivation, for instance, could no longer be incorporated into the testing. This then also meant that, after all, previously identified redundant circuits could possibly not be utilized, which adversely influenced the yield.

INTEGRATED CIRCUIT WITH PADS CONNECTED BY AN UNDER-BUMP METALLIZATION AND METHOD FOR PRODUCTION THEREOF

This is a divisional application of U.S. application Ser. No. 11/409,255, which was filed on Apr. 21, 2006 now U.S. Pat. No. 7,919,363, which is a continuation of International Application No. PCT/DE2004/002284, filed Oct. 14, 2004, which designated the United States and was not published in English, and which is based on German Application No. 103 49 749.8 filed Oct. 23, 2003, all of which applications are incorporated herein by reference.

TECHNICAL FIELD

The invention relates to an antifuse connection for integrated circuits for the activation of redundant circuits or chip functions of flip-chip arrangements with an under-bump metallization on standard pads on the surface of a chip for the incorporation of bumps, and to a method for production of such antifuse connections.

BACKGROUND

Redundant circuits are usually concomitantly integrated in integrated circuits in order to be able to activate these as required. Such redundant circuits are activated if individual circuit parts are not functional on account of a defective processing (e.g., defects, particles). The redundant circuits then undertake the task of the defective circuits and the overall chip is fully functional.

In order to activate the redundant circuit, the integrated circuit has to be electrically isolated from the defective region and be connected to a redundant circuit (replacement circuit). This is done by means of fuses for isolating current paths and antifuses for connecting current paths.

An example of a fuse and an antifuse and also a method for production and activation of a fuse and an antifuse emerge from German patent application 196 04 776 A1 and corresponding PCT application WO 97/29515.

These fuses have hitherto been integrated in the metallization layers of the integrated circuit. In order to isolate a fuse, then, a laser beam is directed onto it and the fuse is blown. What is problematic in this case is that the fuse is encapsulated in a dielectric, so that the encapsulating dielectric layer often bursts open during the fuse blowing operation. This then results in reliability problems such as leakage currents, corrosion, etc.

After the processing of the chips has finished, the chips are electrically checked for functionality prior to mounting into a housing. Non-functioning chips are repaired with the fuses as above before they are mounted into housings.

SUMMARY OF THE INVENTION

The invention is based on the object, then, of providing an antifuse connection for integrated circuits for the activation of redundant circuits, which can be provided with little outlay and in the case of which the problems that can be noted in the prior art do not occur. Furthermore, the intention is to demonstrate a method by which such antifuse connections can be produced.

The object on which the invention is based is achieved by virtue of the fact that further mini-pads are arranged on the surface of the chip alongside the standard pads. The further mini-pads are electrically connected to functional units in the chip. Selected mini-pads are connected to one another by antifuse connections patterned from the under-bump metallization.

Reliability problems are thus avoided because the antifuses are produced by normal patterning of the UBM metallization and a high-energy laser processing is unnecessary.

The object on which the invention is based is furthermore achieved by means of a method for production of antifuse connections, that is characterized in that firstly the UBM metallization is deposited on the chip and a photoresist layer is deposited on the metallization and the regions of the standard pads are exposed. Subsequently, the areas required for the antifuse connections are additionally exposed by means of a laser or an electron beam. Afterward, the photoresist is developed and the UBM metallization including the antifuse connections is patterned.

BRIEF DESCRIPTION OF THE DRAWINGS

The invention will be explained in more detail below using an exemplary embodiment. In the associated figures of the drawing.

Figure 1:
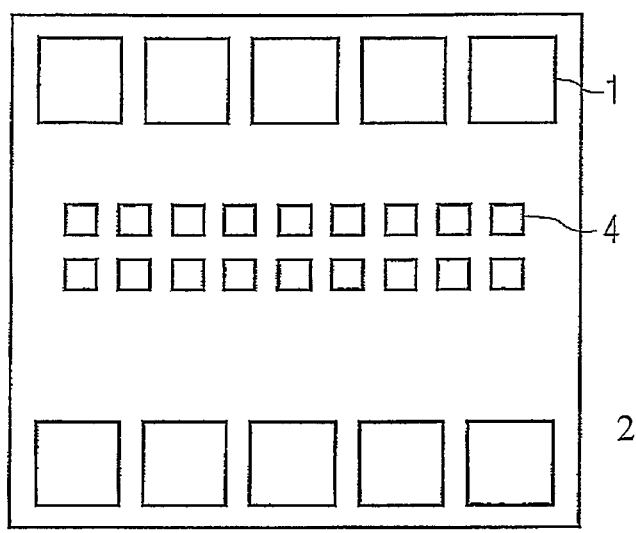
FIG. 1 shows a finished processed chip with standard pads and additional mini-pads for UBM (anti) fuses.

THE FOLLOWING LIST OF REFERENCE SYMBOLS CAN BE USED IN CONJUNCTION WITH THE FIGURES

1 Standard pad
2 Chip
3 UBM metallization
4 Mini-pad
5 Antifuse connection

DETAILED DESCRIPTION OF ILLUSTRATIVE EMBODIMENTS

In the case of the invention described below, a metallization plane, which is used for the application of so-called bumps onto the standard pads 1 on a chip 2 of a flip-chip metallization (UBM: under-bump metallization), is utilized for the formation of fuses or antifuses. After the processing of the wafer has finished, this UBM metallization 3 is deposited in planar fashion on the wafer and, as a result of a subsequent patterning, is left only above the standard pads 1. In a further step, bumps (not illustrated) are then applied to the standard pads 1, by means of which bumps the chip 2 can then be electrically contact-connected to a leadframe or a printed circuit board.

Figure 2:
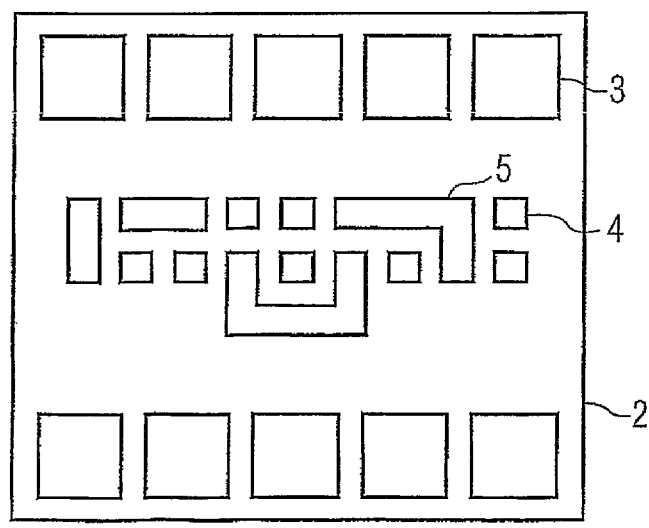
FIG. 2 shows the finished processed chip according to FIG. 1, after the application and patterning of the UBM metallization and with additional UBM antifuse connections.
Figure 3:
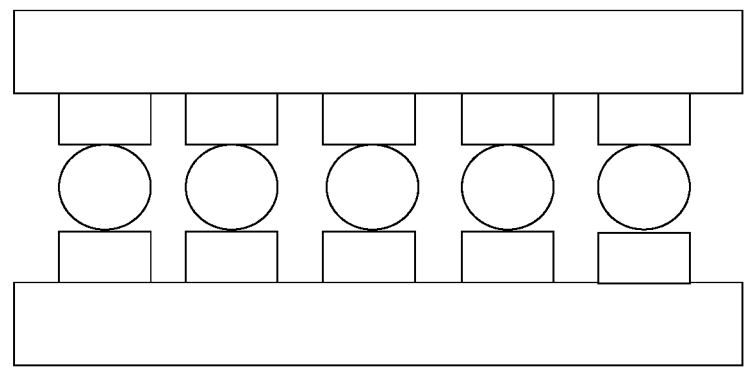
FIG. 3 shows a finished processed chip with a patterned UBM metallization, solder bumps and a printed circuit board.
Figure 4:
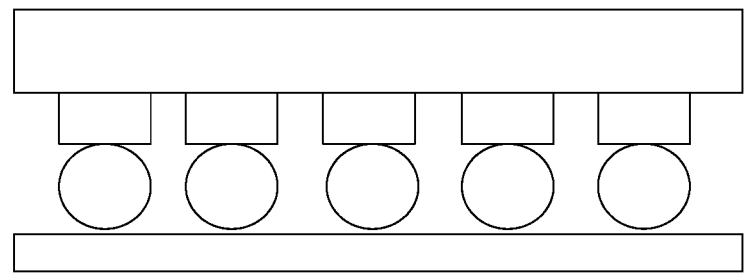
FIG. 4 shows a finished process chip with a patterned UBM metallization, solder bumps and a lead frame.

According to FIG. 1, additional mini-pads 4 are provided, which have been led over the product to the top side of the chip 2. The UBM metallization layer can thus be utilized for producing electrically conductive antifuse connections 5 between the mini-pads 4. In this case, selected mini-pads 4 are short-circuited by the antifuse connections 5 (FIG. 2).

The particular advantage of this "antifusing" can be seen in the fact that it is possible to correct the circuit up to directly prior to the packaging of the circuit, that is to say the mounting of the chip 2 on a leadframe and subsequent molding (encapsulation), that is to say up to the concluding UBM deposition and patterning.

A further advantage lies in the fact that the "antifusing" according to the invention cannot lead to any reliability problems whatsoever in the chip 2 since the antifuse connections 5 are situated on the surface of the chip 2 and are only deposited at the required locations.

Furthermore, in contrast to the laser fuses used hitherto, active or passive components can also be arranged under the antifuse connections 5.

The UBM metallization can be used according to the invention for the antifuse connections 5 described and also for programming the circuit. That is to say, the function of the chip can be defined in terms of hardware here in the case of chips with a plurality of functions outside the production line. Furthermore, the UBM metallization can be used as a chip wiring plane, as a result of which a metallization plane can be obviated, which leads to a significant saving of costs.

Before the patterning of the UBM metallization is performed, all the chips 2 on a wafer are tested with regard to their functionality. Afterward, the UBM metallization is deposited and a photoresist layer is deposited thereon and the regions of the standard pads 1 are exposed, but are not yet developed. Afterward, the areas required for the antifuse connections 5 are then additionally exposed for example by means of a laser or an electron beam. Afterward, the photoresist is then developed and the UBM metallization is patterned. This is then followed by the further processes required for flip-chip mounting.

What is claimed is:

1. A semiconductor device comprising:
a semiconductor chip;
first connection pads disposed on a surface of the semiconductor chip;
second connection pads disposed on the surface of the semiconductor chip;
functional units connected to the second connection pads, wherein selected function units of the functional units comprise redundant circuitry; and
an under-bump metallization layer disposed on the semiconductor chip such that selected ones of the second connection pads are electrically connected to one another.

2. The device of claim 1, wherein the selected ones of the second connection pads are electrically connected to one another so as to program the semiconductor chip.

3. The device of claim 1, further comprising solder bumps disposed over the first connection pads.

4. The device of claim 3, further comprising a printed circuit board connected to the solder bumps.

5. The device of claim 1, wherein the first connection pads are arranged alongside opposite edges of the semiconductor chip and wherein the second connection pads are arranged in a central region of the semiconductor chip between the first connection pads.

6. The device of claim 1, wherein the seconds connection pads are smaller than the first connection pads.

7. An integrated circuit comprising:
a semiconductor chip;
first under-bump metallization pads formed over first pads on a surface of the semiconductor chip, the first under-bump metallization pads configured to receive solder bumps; and
at least one under-bump metallization antifuse connection connecting selected ones of second pads on the surface of the semiconductor chip.

8. The integrated circuit of claim 7, wherein the first pads are larger than the second pads.

9. The integrated circuit of claim 7, wherein the at least one under-bump metallization antifuse connection connects the selected ones of the second pads based on test results derived from testing the semiconductor chip.

10. The integrated circuit of claim 7, wherein the at least one under-bump metallization antifuse connection connects the selected ones of the second pads to enable redundant circuitry within the semiconductor chip.

11. The integrated circuit of claim 7, wherein the first pads are located along a periphery of the semiconductor chip.

12. A packaged device comprising:
a semiconductor chip;
under-bump metallization connection pads disposed on the semiconductor chip; and
at least one under-bump metallization antifuse connection, the under-bump metallization antifuse connection connecting selected functional units in the semiconductor chip.

13. The device of claim 12, wherein the under-bump metallization connection pads are located along an edge of the semiconductor chip.

14. The device of claim 12, further comprising standard pads underlying the under-bump metallization connection pads, wherein the at least one under-bump metallization antifuse connection connects selected ones of further pads disposed on the semiconductor chip.

15. The device of claim 14, wherein the further pads are located in a center region of the semiconductor chip.

16. The device of claim 15, wherein the further pads are smaller than the standard pads.

17. The device of claim 12, further comprising a printed circuit board connected to the semiconductor chip via the under-bump metallization connection pads.

18. The device of claim 17, wherein the printed circuit board is soldered to the semiconductor chip at the under-bump metallization connection pads.

19. A semiconductor device comprising:
a semiconductor chip;
first connection pads disposed on a surface of the semiconductor chip;
second connection pads disposed on the surface of the semiconductor chip; and
an under-bump metallization layer disposed on the semiconductor chip such that selected ones of the second connection pads are electrically connected to one another so as to program the semiconductor chip.

* * * * *